United States Patent
Mazzali

[11] Patent Number: 5,196,914
[45] Date of Patent: Mar. 23, 1993

[54] TABLE CLOTH MATRIX OF EPROM MEMORY CELLS WITH AN ASYMMETRICAL FIN

[75] Inventor: Stefano Mazzali, Milan, Italy

[73] Assignee: SGS-Thomson Microelectronics s.r.l., Agrate Brianza, Italy

[21] Appl. No.: 753,028

[22] Filed: Aug. 29, 1991

Related U.S. Application Data

[63] Continuation of Ser. No. 488,120, Mar. 5, 1990, abandoned.

[30] Foreign Application Priority Data

Mar. 15, 1989 [IT] Italy .................... 19778 A/89

[51] Int. Cl.⁵ .................. H01L 29/78; H01L 29/68
[52] U.S. Cl. ..................... 257/390; 257/443; 257/314
[58] Field of Search ............ 357/23.5, 23.6, 23.11, 357/23.1, 45, 54

[56] References Cited

U.S. PATENT DOCUMENTS

| | | | |
|---|---|---|---|
| 4,422,092 | 12/1983 | Guterman | 357/23.5 |
| 4,490,900 | 1/1985 | Chiu | 357/54 |
| 4,608,591 | 8/1986 | Ipri et al. | 357/23.5 |
| 4,729,115 | 3/1988 | Kauffmann et al. | 357/23.5 |
| 4,750,024 | 6/1988 | Schreck | 357/23.5 |
| 4,766,473 | 8/1988 | Kuo | 357/54 |
| 4,768,080 | 8/1988 | Sato | 357/54 |
| 4,797,725 | 1/1989 | Hashimoto | 357/23.5 |
| 4,825,271 | 4/1989 | Tanaka et al. | 357/54 |
| 4,855,800 | 8/1989 | Esquivel et al. | 357/23.11 |
| 4,868,619 | 9/1989 | Mukherjee et al. | 357/54 |
| 4,892,840 | 1/1990 | Esquivel et al. | 357/23.5 |
| 5,011,787 | 4/1991 | Jeuch | 357/23.5 |
| 5,012,446 | 4/1991 | Bergemont | 357/23.5 |
| 5,036,378 | 7/1991 | Lu et al. | 357/23.5 |

FOREIGN PATENT DOCUMENTS 61-184883  8/1986  Japan .

Primary Examiner—Eugene R. LaRoche
Assistant Examiner—Viet Q. Nguyen
Attorney, Agent, or Firm—Sixbey, Friedman, Leedom & Ferguson

[57] ABSTRACT

A table cloth matrix of EPROM memory cells comprises a semiconductor substrate, parallel source lines and drain lines, floating gate areas interposed in a checkerboard pattern between the source lines and the drain lines and control gate lines, parallel to one another and perpendicular to the source lines and to the drain lines. There are obtained in the semiconductor substrate extensive oxide areas, with which the floating gates are in contact by means of their asymmetrical lateral fin.

4 Claims, 4 Drawing Sheets

TABLE CLOTH MATRIX OF EPROM MEMORY CELLS WITH AN ASYMMETRICAL FIN

This application is a continuation of Ser. No. 07/488,120, filed Mar. 5, 1990, now abandoned.

BACKGROUND OF THE INVENTION

1. Field of the Invention

The present invention relates to a table cloth matrix of EPROM memory cells with an asymmetrical fin.

2. Description of Related Art Including Information Disclosed Under 37 CFR§§1.97-1.99

In the field of memories with EPROM cells one of the fundamental problems is the density of the cells; it is important to succeed in compacting the memory cells as much as possible the better to exploit the available space and to improve performance. For this reason research is oriented towards the study of new structures which overcome these problems.

One of these new structures is the so-called "table cloth" matrix, wherein two groups of source lines and one group of drain lines parallel and alternated to one another are intersected perpendicularly by control gate lines parallel to one another, while floating gate areas are interposed between said source and drain lines beneath said control gate lines.

This configuration is described in the Italian patent application No. 23479 A/84 dated Nov. 7, 1984 and corresponding U.S. Pat. No. 4,792,925 assigned to the assignee of the present application and allows the attainment of good levels of miniaturization and of cell density.

One of the main defects of this structure is the low capacitative coupling between the control gate and the floating gate of each cell.

In fact the coupling area between the gates is practically identical to that between the floating gate and the substrate so that the capacitative ratio is lower than that of standard EPROM cells, and the cell's writing characteristics are thus worsened. The memory is thus highly sensitive to the so-called "drain turn-on", a parasitic effect which can lead to softerasing effects in non-selected cells.

An improvement on this structure is illustrated in the Italian patent application No. 21560 A/88 dated Jul. 29, 1988, and corresponding European Application No. 0352830 assigned to the assignee of the present application. In this structure islands of field oxide are provided in the matrix zone, which, while allowing an improvement in the capacitative coupling between the gates, involve a greater complexity of accomplishment and a lower degree of obtainable integration.

Lastly, in the Italian patent application No. 22848 A/88 dated Dec. 5, 1988and corresponding U.S. Pat. application No. 444,796 filed Dec. 1, 1989 assigned to the assignee of the present application, a variant of the table cloth matrix structure is described. In this Application there are provided field oxide areas formed between the control gate lines, and the floating and control gates are provided with symmetrical lateral fins which are superimposed over the field oxide areas. In this structure the control gate is in contact with the underlying stratum only at narrow lateral fins, while in the central zone contact is prevented by an oxide layer residue from the planarization stage included in the manufacturing process of the matrix. Thus the contact area between the gates is extremely small, and this worsens contact, if it does not altogether prevent it.

SUMMARY OF THE INVENTION

The object of the present invention is to accomplish a matrix of EPROM memory cells of the table cloth type which offers an improved capacitative ratio without requiring particular manufacturing techniques, and which allows considerable compacting possibilities.

According to the invention such object is attained with a matrix of EPROM memory cells, comprising a semiconductor substrate, source lines and drain lines parallel and alternated to one another on said substrate, floating gate areas interposed in a checkerboard pattern between said source lines and drain lines, control gate lines parallel to one another and perpendicular to said source lines and drain lines in a condition superimposed over an intermediate dielectric and aligned with respect to said floating gate areas, and extensive areas of field oxide formed on said substrate, characterized in that each of said floating gate areas is provided with a single lateral fin superimposed with an extensive contact surface over one of said field oxide areas.

In this way each control gate is in contact with the underlying floating gate area at the extensive surface of the latter's lateral fin. This improves electrical contact between the two gates, increasing the capacitative ratio and thus the performance of the cell.

The superimposed part of the control gate, with planarization oxide interposed at the part of the floating gate in contact with the substrate is itself much reduced, and thus its effect is negligible.

BRIEF DESCRIPTION OF THE DRAWING

The characteristics and the advantages of the present invention shall be made more evident by the following detailed description of some possible embodiments illustrated as non-limiting examples in the following drawings wherein.

DESCRIPTION OF THE PREFERRED EMBODIMENT'(S)

Figure 1:
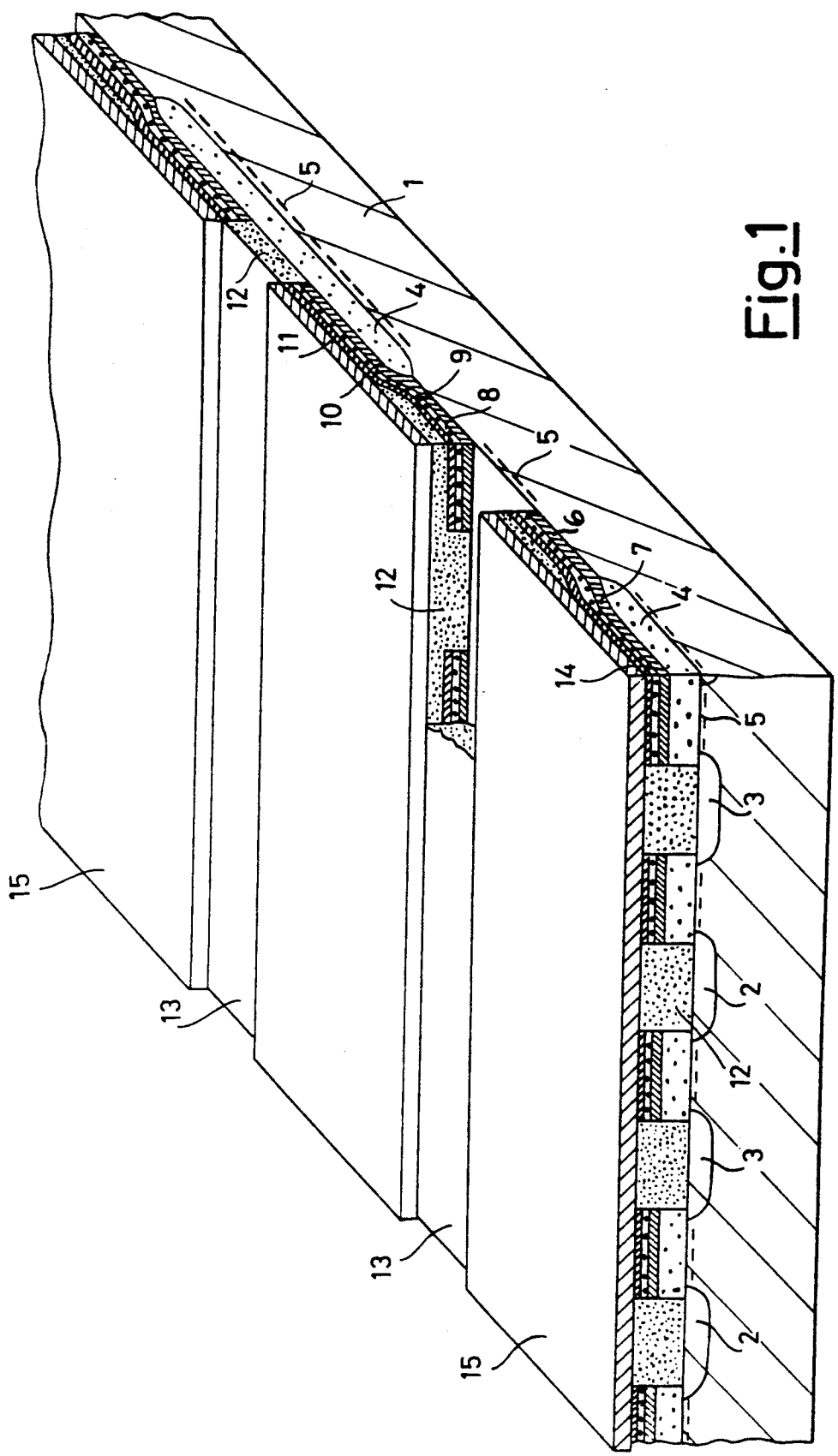
FIG. 1 is a perspective cross-section of a portion of a table cloth matrix according to the invention.
Figure 2:
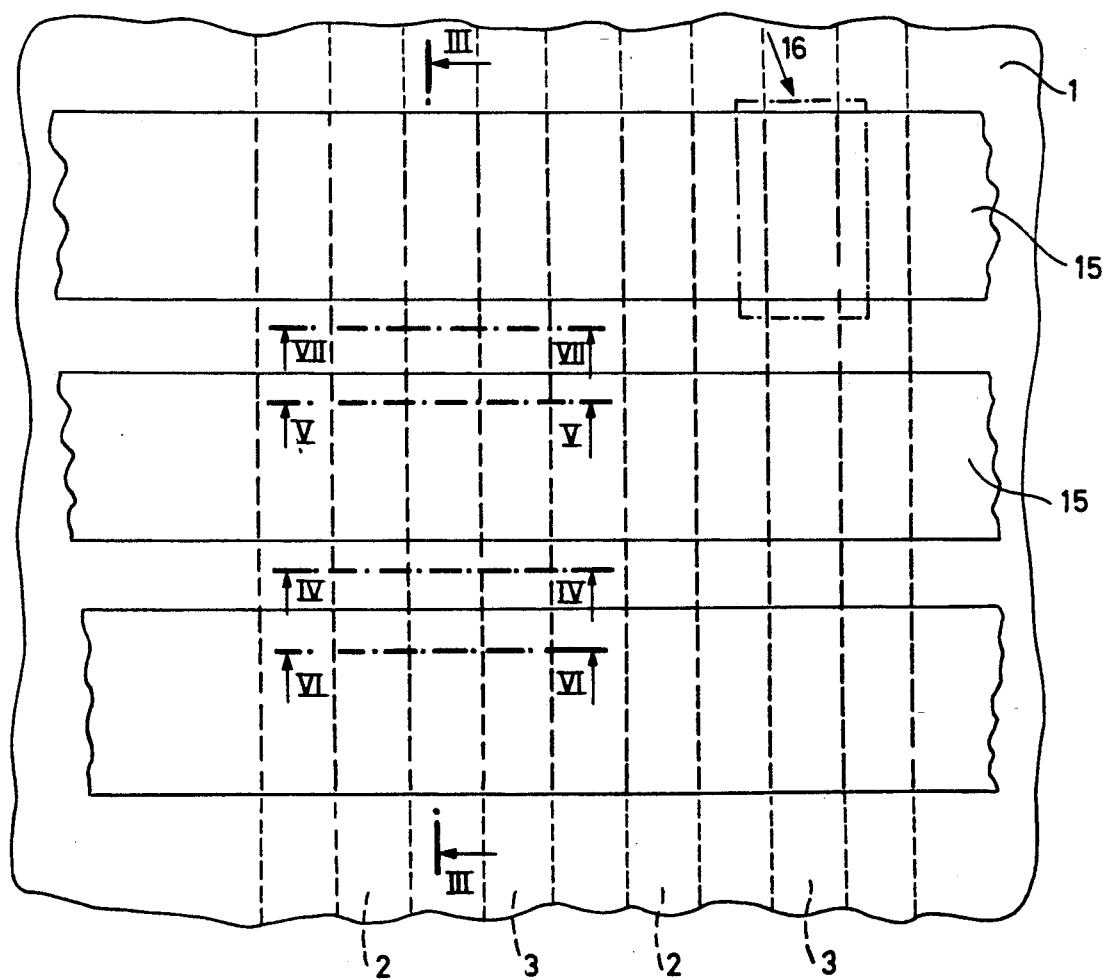
FIG. 2 is a plan view from above of a portion of the table cloth matrix of FIG. 1.

The memory matrix consists of a substrate 1 (FIG. 1) in which there are obtained parallel source lines 2 and drain lines 3 (FIGS. 1 and 2). An insulating system 5 is diffused in the substrate by means of a doping agent. As shall be made clearer later, this insulating system 5 is diffused only in the areas wherein there is an oxide in contact with said substrate 1 so as to avoid residual diffusion currents. Extensive areas of field oxide 4 are made to grow on substrate 1, interposed between the source lines 2 and the drain lines 3. Areas of floating gate 6 are arranged in a checkerboard pattern between said source lines 2 and drain lines 3. As shown in FIGS.

1 and 3, the areas of floating gate 6 have an asymmetrical fin 7 which is superimposed on the field oxide 4. Areas of dielectric 8 and areas of barrier polysilicon 9 are arranged on the areas of floating gate 6. Both the areas of dielectric 8 and the areas of polysilicon 9 have a fin, 10 and 11 respectively, which is superimposed and aligned over the corresponding fin 7 of the underlying floating gate 6.

Areas of planarized oxide 12 are deposited between each group formed by floating gate 6, areas of dielectric 8 and of polysilicon 9. These oxide areas constitute the residue of the thick planarization oxide after its removal until the upper surface 13 of the oxide itself coincides with the upper surface 14 of fin 11 of polysilicon 9.

Lastly control gate lines 15, say of polysilicon, are arranged perpendicularly to the source lines 2 and to the drain lines 3, in a condition superimposed and self-aligned with each group formed by floating gate 6, by dielectric area 8 and polysilicon area 9.

Figure 3:
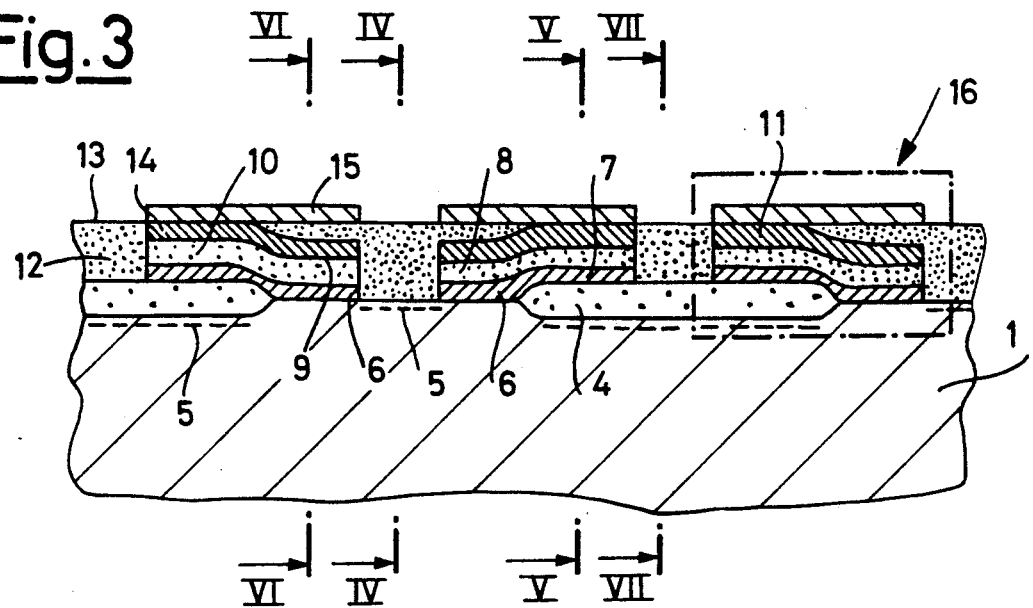
FIG. 3 shows said portion of the table cloth matrix in a cross-sectional view taken along the line III—III of FIG. 2.
Figure 4:
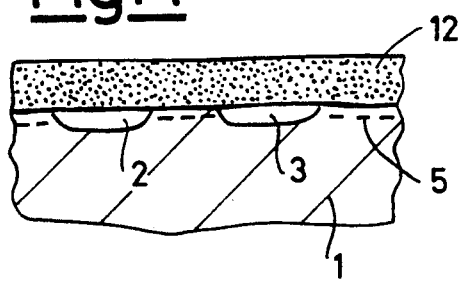
FIGS. 4, 5, 6, and 7 show enlarged details of the above table cloth matrix, along the lines IV—IV, V—V, VI—VI and VII—VII, respectively, of FIGS. 2 and 3.
Figure 5:
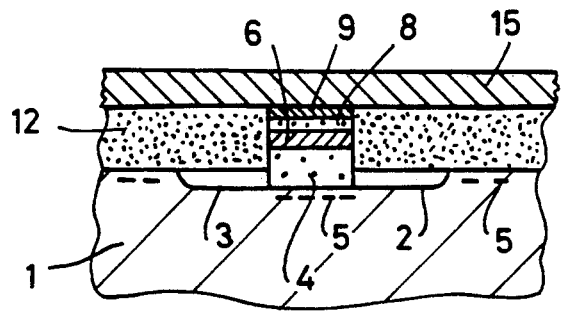
Figure 6:
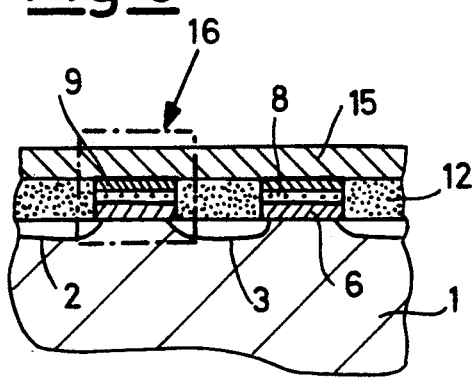
Figure 7:
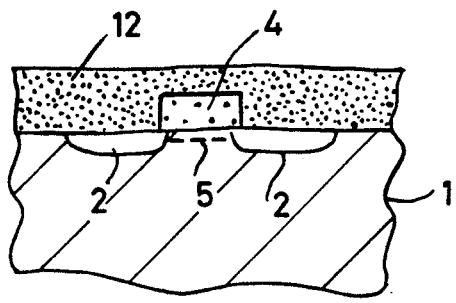
Figure 8:
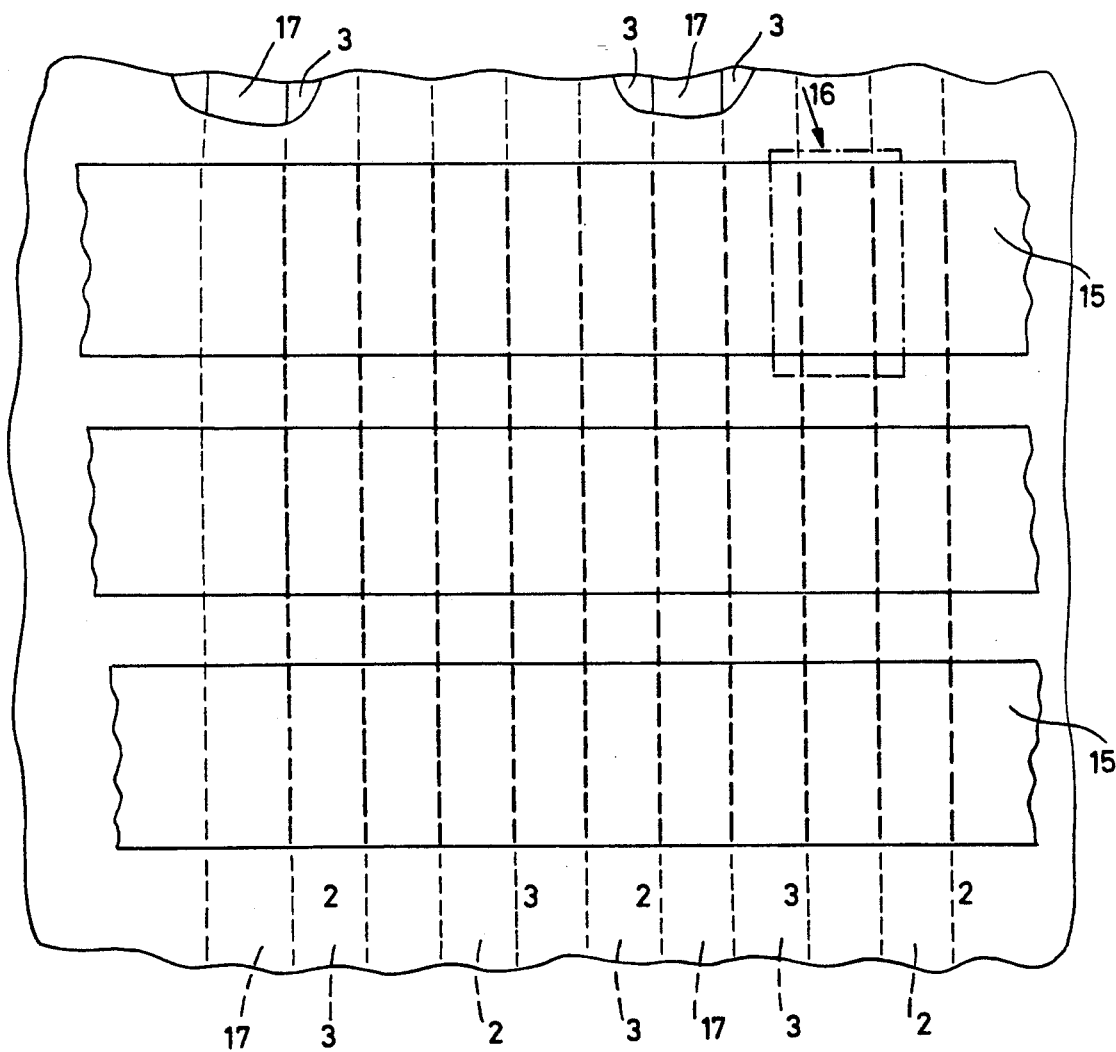
FIG. 8 shows a plan view from above of a portion of a further embodiment of the table cloth matrix according to the invention.

There is thus obtained in this way a matrix of EPROM memory cells, such as that indicated with 16 in FIGS. 2, 3 and 6.

As already mentioned, the insulation system 5 exists only in the areas of contact between field oxide 4 or planarized oxide 12 and substrate 1.

The table cloth matrix according to the invention is also applicable to the memory matrix structure illustrated in the Italian patent application No. 21560 A/88 dated Jul. 29, 1988, and corresponding European Application No. 0352830 assigned to the assignee of the present application.

In this structure two drain lines 3 are alternated with each source line 2 and strips of oxide 17 are also present, parallel to the source lines and to the drain lines, which divide the matrix of memory cells into a plurality of groups of cells insulated from one another. In this way a table cloth memory matrix is obtained, whose individual cells are accessible by traditional decoding.

I claim:

1. A matrix of EPROM memory cells, comprising a semiconductor substrate, source lines and drain lines parallel to and alternated with one another, field oxide areas interposed in a checkerboard pattern between said source and drain lines to define uncovered active areas of the substrate, pairs of floating gate areas associated to respective pairs of adjacent field oxide areas and to interposed active areas, each said pair of floating gate areas consisting of first and second floating gate areas, so that said first floating gate area of at least one of said pairs of floating gate areas has a first portion facing to a corresponding first portion of said second floating gate area of the same pair and superimposed to said active area, and a second portion forming a single lateral fin of said first floating gate area and superimposed to a respective field oxide area, and control gate lines parallel to one another and perpendicular to said source and drain lines and superimposed to and aligned with said first and second floating gate areas.

2. The matrix of EPROM memory cells of claim 1 wherein said first floating gate area is associated with one EPROM memory cell and said second floating gate area is associated with an EPROM memory cell different from said one EPROM memory cell.

3. A cell matrix according to claim 1, further including dielectric and polysilicon areas superimposed to and aligned with said floating gate areas.

4. A cell matrix according to claim 1, wherein each source line is alternated with a pair of drain lines separated by interposed field oxide strips.

* * * * *